US008473812B2

(12) United States Patent
Ramamoorthy et al.

(10) Patent No.: US 8,473,812 B2
(45) Date of Patent: *Jun. 25, 2013

(54) METHOD AND SYSTEM FOR ERROR CORRECTION IN FLASH MEMORY

(75) Inventors: Aditya Ramamoorthy, Ames, IA (US); Zining Wu, Los Altos, CA (US); Pantas Sutardja, Los Gatos, CA (US)

(73) Assignee: Marvell World Trade Ltd., St. Michael (BB)

( * ) Notice: Subject to any disclaimer, the term of this patent is extended or adjusted under 35 U.S.C. 154(b) by 154 days.

This patent is subject to a terminal disclaimer.

(21) Appl. No.: 12/946,520

(22) Filed: Nov. 15, 2010

(65) Prior Publication Data

US 2011/0060969 A1    Mar. 10, 2011

Related U.S. Application Data

(63) Continuation of application No. 11/598,117, filed on Nov. 8, 2006, now Pat. No. 7,844,879.

(60) Provisional application No. 60/760,622, filed on Jan. 20, 2006, provisional application No. 60/761,888, filed on Jan. 25, 2006, provisional application No. 60/771,621, filed on Feb. 8, 2006.

(51) Int. Cl.
*H03M 13/00* (2006.01)

(52) U.S. Cl.
USPC ....... 714/763; 365/185.09; 365/200; 365/201

(58) Field of Classification Search
USPC ................. 714/763; 365/185.09, 233.13, 200, 365/201
See application file for complete search history.

(56) References Cited

U.S. PATENT DOCUMENTS

| 4,610,022 A | 9/1986 | Kitayama et al. |
| 5,365,530 A | 11/1994 | Yoshida |
| 5,469,448 A | 11/1995 | Denissen et al. |

(Continued)

FOREIGN PATENT DOCUMENTS

| EP | 1065594 | 3/2001 |
| JP | 09-251427 | 9/1997 |

(Continued)

OTHER PUBLICATIONS

Taiwan Intellectual Property Office, first Office Action issued in Taiwanese Application No. 096102213, dated Sep. 6, 2010, with English translation (10 pages).

(Continued)

*Primary Examiner* — Esaw Abraham

(57) ABSTRACT

A multi-level solid state non-volatile memory array has memory cells that store data using a first number of digital levels. A controller of the memory array encodes a series of data bits to generate a series of encoded data bits, and converts the series of encoded data bits into a series of data symbols. The controller sends, to the memory array, a stored series of data symbols based on the series of data symbols for storage in a memory cell of the multi-level solid state non-volatile memory array. The controller generates an output signal based on data associated with the stored series of data symbols. The output signal is characterized by a second number of digital levels greater than the first number of digital levels. The controller outputs a series of output data symbols based on the output signal.

18 Claims, 16 Drawing Sheets

U.S. PATENT DOCUMENTS

| | | | |
|---|---|---|---|
| 6,064,591 A * | 5/2000 | Takeuchi et al. | 365/185.03 |
| 6,279,133 B1 | 8/2001 | Vafai et al. | |
| 6,442,726 B1 | 8/2002 | Knefel | |
| 6,715,116 B2 | 3/2004 | Lester et al. | |
| 6,801,457 B2 * | 10/2004 | Tanzawa et al. | 365/185.22 |
| 6,865,125 B2 * | 3/2005 | Tanzawa et al. | 365/200 |
| 6,901,011 B2 | 5/2005 | Micheloni et al. | |
| 6,967,858 B2 * | 11/2005 | Kang | 365/145 |
| 7,043,162 B2 | 5/2006 | Kubo et al. | |
| 7,061,812 B2 * | 6/2006 | Shinagawa et al. | 365/185.29 |
| 7,142,612 B2 | 11/2006 | Horowitz et al. | |
| 7,259,997 B2 | 8/2007 | You | |
| 7,305,596 B2 * | 12/2007 | Noda et al. | 714/718 |
| 7,310,768 B2 | 12/2007 | Eidson et al. | |
| 7,346,829 B2 | 3/2008 | Riho et al. | |
| 7,366,022 B2 * | 4/2008 | Li et al. | 365/185.22 |
| 7,379,505 B2 | 5/2008 | Zaleski et al. | |
| 7,443,723 B2 * | 10/2008 | Guterman et al. | 365/185.03 |
| 7,668,381 B2 | 2/2010 | Masumoto et al. | |
| 2001/0025358 A1 | 9/2001 | Eidson et al. | |
| 2002/0038440 A1 | 3/2002 | Barkan | |
| 2004/0032774 A1 | 2/2004 | Hirano | |
| 2004/0042294 A1 | 3/2004 | Guterman et al. | |
| 2004/0062111 A1 | 4/2004 | Tanzawa et al. | |
| 2004/0083334 A1 | 4/2004 | Chang et al. | |
| 2004/0161048 A1 | 8/2004 | Zaleski, II et al. | |
| 2005/0074173 A1 | 4/2005 | Lee et al. | |
| 2005/0229076 A1 | 10/2005 | Riho et al. | |
| 2005/0268208 A1 | 12/2005 | Shimizume et al. | |
| 2007/0204206 A1 | 8/2007 | Lee et al. | |

FOREIGN PATENT DOCUMENTS

| | | |
|---|---|---|
| JP | 09284348 | 10/1997 |
| JP | 11143787 | 5/1999 |
| JP | 11213693 | 5/1999 |
| JP | 2000286719 | 10/2000 |
| JP | 2001-14888 | 1/2001 |
| JP | 2001-508218 | 6/2001 |
| JP | 2004-71082 | 3/2004 |
| JP | 2005078721 | 3/2005 |
| JP | 2005-346758 | 12/2005 |
| KR | 246184 B1 | 12/1999 |
| TW | 575806 B | 12/2004 |
| WO | WO97/41640 | 11/1997 |
| WO | WO 02/086719 A2 | 10/2002 |
| WO | WO03100791 | 12/2003 |
| WO | WO 2005/036401 A2 | 4/2005 |

OTHER PUBLICATIONS

Supplementary European Search Report mailed Jun. 29, 2009, for International Application No. PCT/US2007001620.

Examination Report mailed Sep. 28, 2009, for European Patent Application No. 07718319.2.

Examination Report mailed Sep. 28, 2009, for European Patent Application No. 07718293.9.

State Intellectual Property Office of the People's Republic of China; Translation of Text of the First Office Action; Application No. 200780009987.1; dated Jun. 11, 2010, pp. 1-9.

International Search Report mailed Oct. 18, 2007, for International Application No. PCT/US2007/0001623 (2 pages).

Written Opinion of the International Searching Authority mailed on Oct. 18, 2007, for International Application No. PCT/US2007/0001623 (5 pages).

Supplementary European Search Report mailed Jun. 24, 2009, for International Application No. PCT/US2007/0001623 (6 pages).

Taiwan Intellectual Property Office Text of the First Office Action for Application No. 096102390 dated Apr. 7, 2010, including English translation (17 pages).

U.S. Office Action dated Jan. 27, 2010, directed against U.S. Appl. No. 11/598,178, (15 pages).

U.S. Office Action dated Jun. 14, 2010, directed against U.S. Appl. No. 11/598,178, (13 pages).

Battail et al., "Pseudo-Random Recursive Convolutional Coding for Near-Capactiy Performance" Global Telecommunications Conference, IEEE vol. 4, (1993) pp. 23-27.

Benedetto, "Design of Parallel Concatenated Convolutional Codes" IEEE Transactions on Communications, vol. 44, No. 5 (May 1996) pp. 591-600.

Benedetto et al., "Serial Concatenated Trellis Coded Modulation with Iterative Decoding" Proceedings 1997 IEEE International Symposium on Information Theory, (Jun. 29-Jul. 4, 1997) p. 8.

Blaum, "A Family of Efficient Burst-Correcting Array Codes" IEEE Transactions on Information Theory, vol. 36, No. 3 (May 1990), pp. 671-675.

Gallager, "Low-Density Parity-Check Codes" IRE Transactions on Information Theory, (Jan. 1962), pp. 21-28.

Hewitt, "Turbo Product Codes for LMDS" Radio and Wireless Conference, RAWCON 99, IEEE (Aug. 1-4, 1999) pp. 107-111.

Imai and Hirakawa, "A New Multilevel Coding Method Using Error-Correcting Codes" IEEE Transactions on Information Theory, vol. IT-23, No. 3, (May 1977) pp. 371-377.

Ungerboeck, "Channel Coding with Multilevel/Phase Signals" IEEE Transactions on Information Theory, vol. IT-28, No. 1, (Jan. 1982), pp. 55-67.

Wei, "Trellis-Coded Modulation with Multidimensional Constellations" IEEE Transactions on Information Theory, vol. IT-33, No. 4 (Jul. 1987), pp. 483-501.

Wicker, Ed., "Error Control Systems for Digital Communication and Storage" Prentice-Hall, Inc., Englewood Cliffs, NJ 1995. The title page, copyright page and table of contents are enclosed herewith, 9 pages total.

Wu, U.S. Appl. No. 09/730,603 57 pages total.

Summary of Notice of Reasons for Rejection, JP Application No. 2008-551453; Akihiro Ryuka; May 29, 2012, 2 pages.

Summary of Notice of Reasons for Rejection, JP Application No. 2008-551451; Akihiro Ryuka; May 29, 2012, 2 pages.

Summary of Notice of Reasons for Rejection, JP Application No. 2008-551451; Akihiro Ryuka; Sep. 18, 2012, 5 pages.

Summary of Notice of Reasons for Rejection, JP Application No. 2008-551453; Akihiro Ryuka; Sep. 18, 2012, 2 pages.

* cited by examiner

METHOD AND SYSTEM FOR ERROR CORRECTION IN FLASH MEMORY

CROSS-REFERENCES TO RELATED APPLICATIONS

This application is a continuation application of commonly-assigned U.S. patent application Ser. No. 11/598,117 (U.S. Pat. No. 7,844,879), filed Nov. 8, 2006, which claims benefit under 35 U.S.C. §119(e) of the following U.S. provisional applications, all of which are commonly assigned and incorporated herein by reference in their entirety:

Provisional Application No. 60/760,622, entitled "Flash Memory—Error Correction Issues," filed on Jan. 20, 2006;

Provisional Application No. 60/761,888, entitled "Increase Storage Capacity of Flash Memory through Coding and Signal Processing," filed on Jan. 25, 2006; and Provisional Application No. 60/771,621, entitled "Increase Storage Capacity of Flash Memory through Coding and Signal Processing," filed on Feb. 8, 2006;

The present application is also related to concurrently filed U.S. patent application Ser. No. 11/598,178, entitled "Flash Memory with Coding and Signal Processing," commonly assigned and incorporated herein by reference in its entirety.

BACKGROUND OF THE INVENTION

The present invention relates generally to integrated circuits. More particularly, the invention relates to a method and system for performing error correction in multi-level solid state non-volatile memories.

Solid state non-volatile memories, such as flash EEPROM memories, are used in a variety of electronics applications. Flash memories are used in a number of memory card formats, such as CompactFlash (CF), MultiMediaCard (MMC) and Secure Digital (SD). Electronic systems in which such cards are used include personal and notebook computers, hand-held computing devices, cameras, MP3 audio players, and the like. Flash EEPROM memories are also utilized as bulk mass storage in many host systems.

Conventional solid state memories store information as a series of binary digits or "bits," which can take on one of two different values (0 or 1). Bits are grouped together to represent larger numbers.

As with most solid state non-volatile memory devices, flash EEPROMs are susceptible to defects and failures. Errors result from several factors including the gradual shifting of the threshold level of the memory states as a result of ambient conditions and stress from normal operations of the memory device including program, erase, and read operations. In order to prevent errors during operation, error correction code (ECC) techniques are utilized in flash memory devices. Typically, a controller generates redundant bits (parity bits) that are appended to the end of data sectors during program operations. For example, a 512 byte data sector may have 16 bytes of ECC data appended, resulting in a 528 byte page. During read operations, the redundant data included in the 16 bytes of ECC data is utilized to detect and correct errors in the data read out from the flash memory.

For a conventional memory, the maximum storage density is determined by the size of the individual storage elements and the number of storage elements that can be integrated onto a single integrated circuit chip. Typically, increases in memory density have been provided by shrinking the linewidth of the process geometry used to fabricate the memory cells.

Another technique used to increase solid state non-volatile memory density is storing more than one bit per memory cell, also referred to as a multi-level memory cell. Rather than sensing whether or not charge is stored in a given memory cell (i.e., a binary cell), multi-level memories utilize a sense amplifier that senses the amount of charge stored in a capacitive storage cell. By quantizing information into units greater than binary, e.g., 4-level (2 bits/cell), 8-level (3 bits/cell), 16-level (4 bits/cell) units, and the like, and storing these multi-level units, the memory density can be increased. As an example, a cell may be programmed to produce four distinct threshold levels, which results in four distinct read-back levels. With a four level signal available per cell, two data bits can be encoded into each solid state non-volatile memory cell. Multi-level memories enable the manufacturing of higher density memories without increasing the number of memory cells since each memory cell can store more than a single bit. Merely by way of example, for a memory cell capable of storing 2 bits/cell, there may be three programmed states and an erased state. FIG. 1 is a simplified probability distribution function (PDF) as a function of voltage for a solid state non-volatile memory cell having a 4-level quantization. In the memory cell illustrated in FIG. 1, four programmed states are utilized. As illustrated, in some solid state non-volatile memories, the PDF of programming characteristics has a wider distribution at lower voltage levels.

However, increasing the number of quantization levels in a cell results in a reduction in the voltage difference between adjacent levels. In multi-level encoding systems, this reduction is sometimes referred to as reduced signal distance (reduced $D_{min}$). Reduced signal distance may impact non-volatile memory performance in both write (program) as well as read operations. During programming, it is more difficult to transfer multiple discrete units of charge to a capacitive cell than it is simply to fully charge or fully discharge the cell. Thus, uncertainty in the amount of charge transferred to a given cell may result in a level shift, resulting in a "program disturb" in which the wrong level is stored in the cell. During reading, "read disturbs" occur when the distribution of one signal level overlaps the distribution of an adjacent signal level. Because the signal distance is reduced, the increase in the number of discrete values stored in the cell reduces the noise margin of the cell as compared to a binary storage cell, making the storage element more prone to erroneous readout. Read disturbs are more common for low-level signals, which are characterized by larger noise distributions as shown in FIG. 1.

The reduction in voltage separation between adjacent levels in a multi-level solid state non-volatile memory may lead to an increase in the number of errors in comparison with conventional solid state non-volatile memory cells. Thus, it would be desirable to provide improved methods and techniques for operating solid state non-volatile memory with multi-level cells.

SUMMARY OF THE INVENTION

According to an embodiment of the present invention, a solid state non-volatile memory unit is provided. The memory unit includes a multi-level solid state non-volatile memory array adapted to store data characterized by a first number of digital levels. The memory unit also includes an analog-to-digital converter. The analog-to-digital converter is adapted to receive data from the multi-level solid state non-volatile memory array. The analog-to-digital converter is also adapted to output a digital signal characterized by a second number of digital levels greater than the first number of digital levels.

According to another embodiment of the present invention, a method of operating a solid state non-volatile memory unit is provided. The method includes encoding a first data and storing the encoded first data in a multi-level solid state non-volatile memory array. The stored encoded first data is characterized by a first number of digital levels. The method also includes retrieving the first encoded data from the memory array and digitizing the retrieved data to a number of digital levels greater than the number of digital levels associated with the multi-level solid state non-volatile memory array.

According to an alternative embodiment of the present invention, a controller for a multi-level solid state non-volatile memory array characterized by a first number of digital levels is provided. The controller includes a first encoder adapted to receive a series of data bits and provide a series of encoded data bits. The controller also includes a mapper adapted to convert the series of encoded data bits into a series of data symbols for storage in the multi-level solid state non-volatile memory array. The controller further includes a first decoder adapted to receive a series of voltage signals from the multi-level solid state non-volatile memory array and generate a series of output data symbols characterized by a second number of digital levels greater than the first number of digital levels.

According to yet another embodiment of the present invention, a method of operating a controller for a multi-level solid state non-volatile memory array characterized by a first number of digital levels is provided. The method includes encoding a first series of data bits to provide a series of encoded data bits and converting the series of encoded data bits into a series of data symbols. The method also includes storing the series of data symbols in the multi-level solid state non-volatile memory array and retrieving the series of data symbols. The method further includes decoding the series of data symbols to provide a series of output data symbols characterized by a second number of digital levels greater than the first number of digital levels.

According to a particular embodiment of the present invention, a solid state non-volatile memory unit is provided. The memory unit includes means for encoding a first data and means for storing the encoded first data in a multi-level solid state non-volatile memory array. The stored encoded first data is characterized by a first number of digital levels. The memory unit also includes means for retrieving the first encoded data from the memory array and means for digitizing the retrieved data to a number of digital levels greater than the number of digital levels associated with the multi-level solid state non-volatile memory array.

According to another particular embodiment of the present invention, a controller for a multi-level solid state non-volatile memory array characterized by a first number of digital levels is provided. The controller includes means for encoding a first series of data bits to provide a series of encoded data bits and means for converting the series of encoded data bits into a series of data symbols. The controller also includes means for storing the series of data symbols in the multi-level solid state non-volatile memory array and means for retrieving the series of data symbols. The controller further includes means for decoding the series of data symbols to provide a series of output data symbols characterized by a second number of digital levels greater than the first number of digital levels.

Still other embodiments of the present invention may be implemented in code, for example, by a digital signal processor (DSP). One such embodiment includes code for encoding a first data and means for storing the encoded first data in a multi-level solid state non-volatile memory array. The stored encoded first data is characterized by a first number of digital levels. The embodiment also includes code for retrieving the first encoded data from the memory array and code for digitizing the retrieved data to a number of digital levels greater than the number of digital levels associated with the multi-level solid state non-volatile memory array.

In another embodiment implemented in code, for example, by a DSP, code for controlling a multi-level solid state non-volatile memory array characterized by a first number of digital levels is provided. The embodiment includes code for encoding a first series of data bits to provide a series of encoded data bits and code for converting the series of encoded data bits into a series of data symbols. The embodiment also includes code for storing the series of data symbols in the multi-level solid state non-volatile memory array and code for retrieving the series of data symbols. The embodiment further includes code for decoding the series of data symbols to provide a series of output data symbols characterized by a second number of digital levels greater than the first number of digital levels.

Many benefits are achieved by way of the present invention over conventional techniques. For example, embodiments of the present invention provide solid state non-volatile memory systems with increased storage density. Moreover, some embodiments improve the reliability of data read from solid state non-volatile memories. Depending upon the embodiment, one or more of these benefits, as well as other benefits, may be achieved. These and other benefits will be described in more detail throughout the present specification and more particularly below in conjunction with the following drawings.

DETAILED DESCRIPTION OF SPECIFIC EMBODIMENTS

Figure 2A:
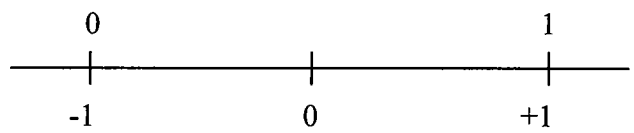
FIG. 2A is a constellation diagram for an uncoded one bit PAM scheme.
Figure 2B:
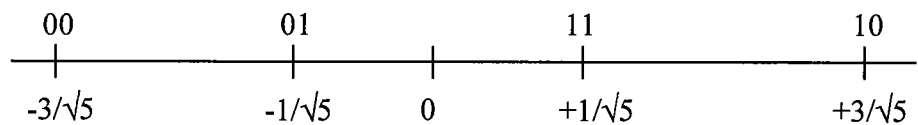
FIG. 2B is a constellation diagram for a two-bit data modulated using a PAM scheme having an average power of 1.

FIG. 2A is a constellation diagram for an uncoded one bit PAM (pulse amplitude modulation) scheme according to which, information is stored as either a 0 (−1 volts) or a 1 (+1 volts). FIG. 2B is a constellation diagram for a two-bit data modulated using a PAM scheme having an average power of 1. The four states defined by the two bits, namely states (00, 01, 10, and 11) are mapped to one of four possible levels, for example, $-3/\sqrt{5}$ volts, $-1/\sqrt{5}$ volts, $+1/\sqrt{5}$ volts, and $+3/\sqrt{5}$ volts. Given these voltages, both the 2-points PAM (2-PAM) and the 4-points PAM (4-PAM) with 1/2 code rate provide a 1 bit/cell spectral efficiency and are characterized by equal power. For the modulation scheme illustrated by FIG. 2B, the 4-state code with Gray mapping reduces bit error rate over the 4-state natural mapping.

In solid state non-volatile memory devices, the maximum voltage applied at the floating gate limits the maximum voltage available for mapping of multi-level symbols. This voltage limitation results in a peak constraint on the constellation values of the applied modulation and encoding scheme. Thus, for a solid state non-volatile memory device, the constellation points must account for this limitation. The maximum voltage constraint characteristic of solid state non-volatile memory systems contrasts with other channels in which additional power increases are available. Accordingly, embodiments of the present invention utilize modulation and encoding schemes for multi-level non-volatile solid state memories designed to be operable in spite of such constraints.

Figure 2C:
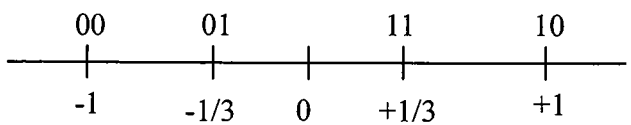
FIG. 2C is a constellation diagram for a two-bit data modulated using a PAM scheme having a peak limit of ±1 for use in a solid state non-volatile memory cell.

FIG. 2C is a constellation diagram for a two-bit data modulated using a PAM scheme having a peak value limited to ±1 for use in a solid state non-volatile memory cell. Symbol 00 is mapped to a signal amplitude of −1 volts and symbol 10 is mapped to a signal amplitude of +1 volts, which in this example, correspond to the maximum voltages stored by a given solid state non-volatile memory cell. Applying power scaling to account for the maximum allowable voltage across the non-volatile solid state memory cells, it is seen that the squared free distance is reduced by a factor of 5/9, resulting in a 0 dB coding gain over an uncoded 2-PAM system.

As the number of levels increases, the signal to noise ratio (SNR) decreases. However, the slope of the SNR decrease is not the same for these two systems. Referring to FIGS. 2B and 2C, the SNR is related to the minimum distance between the nearest neighbors in the constellation map. Consequently, voltage constraints in solid state non-volatile memory devices reduce the available minimum distance and the SNR. Therefore, for a given number of levels, memory systems generally have a lower SNR compared to other known systems. As a result of these differences, the encoding and modulation techniques, in accordance with various embodiments of the present invention, are adapted to the environment characteristic of solid state non-volatile memories.

Assuming equal energy constellations, for an uncoded system, the error probability ($P_{uncoded}$) is upper bounded by:

$$P_{uncoded} \leq A_{min} Q\left(\sqrt{\frac{d_{min}^2}{2N_0}}\right) \approx \frac{A_{min}}{2} \exp\left(\frac{-d_{min}^2}{4N_0}\right), \quad (1)$$

where $A_{min}$ is the number of nearest neighbors, $d_{min}^2$ is the minimum distance squared between two points in a constellation, and $Q(x)$ is the complementary error function (co-error function).

For a coded system:

$$P_{coded} \leq A_{dfree} Q\left(\sqrt{\frac{d_{dfree}^2}{2N_0}}\right) \approx \frac{A_{dfree}}{2} \exp\left(\frac{-d_{dfree}^2}{4N_0}\right), \quad (2)$$

where $d_{free}$ is the minimum distance.

The asymptotic coding gain is defined by:

$$\gamma = \frac{d_{dfree}^2}{d_{min}^2}. \quad (3)$$

For the coded system, the minimum distance $d_{free}$ is generally increased in comparison to the uncoded system, resulting in an asymptotic coding gain greater than one. However, the number of nearest neighbors also increases so the real coding gain is somewhat reduced.

Figure 3A:
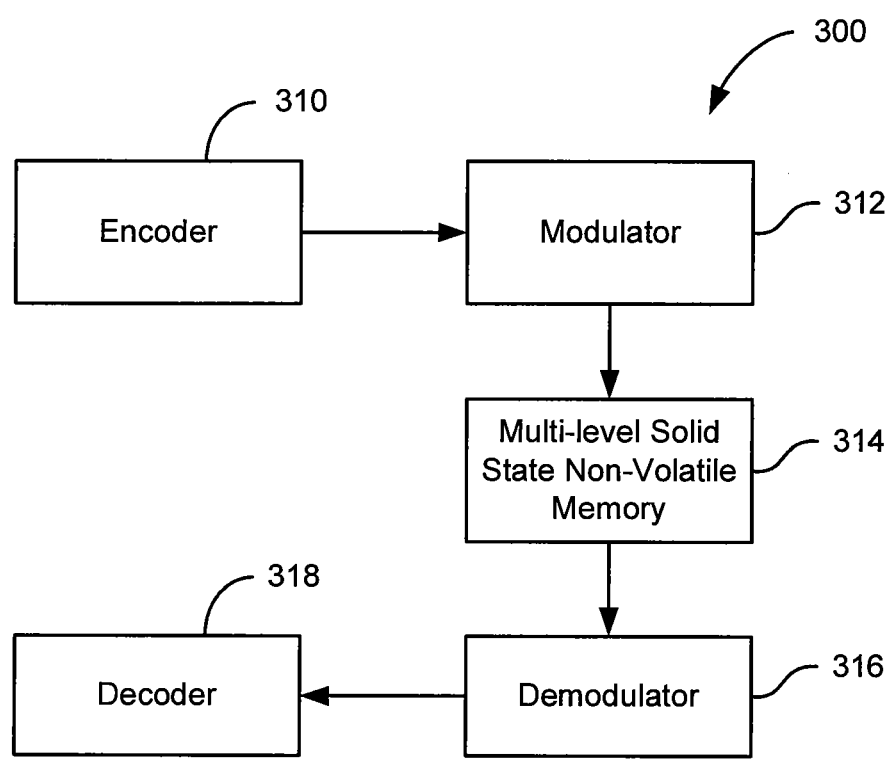
FIG. 3A is a simplified block diagram of an exemplary solid state non-volatile memory unit with error correction code according to an embodiment of the present invention.

FIG. 3A is a simplified block diagram of an exemplary solid state non-volatile memory unit 300 with an ECC according to an embodiment of the present invention. User data to be written into the multi-level memory cells of multi-level solid state non-volatile memory 314 are ECC encoded by encoder 310 to add redundant symbols. The encoded data is passed to modulator 312 for channel encoding. According to embodiments of the present invention, any one of a number of encoding and modulation techniques may be used.

Multi-level solid state non-volatile memory 314 receives encoded and modulated data from modulator 312. Multi-level solid state non-volatile memory 314 may be a flash EEPROM, or the like. Generally, a multi-level flash memory includes one or more flash memory cell arrays and read and write (program) circuitry. In addition to a multi-level flash memory, there are other types of solid state non-volatile memory technologies that are included within the scope of the present invention. Floating gate memory cells such as flash memories are discussed herein merely by way of example. Embodiments of the present invention as described throughout the present specification also apply to other memory technologies other than floating gate technology with the appropriate modifications. One of ordinary skill in the art would recognize many variations, modifications, and alternatives.

Data is read from multi-level solid state non-volatile memory 314 and passes to demodulator 316 and decoder 318. The demodulator in embodiments of the present invention includes signal processing logic adapted to extract soft information related to the data stored in the multi-level solid state non-volatile memory 314. In conventional binary non-volatile memory systems, a threshold detector is utilized to determine if a voltage value associated with a particular cell is less than or greater than a given threshold value. This threshold-based approach is also utilized in multi-level memory systems, where the threshold detection circuit merely utilizes a greater number of threshold values. Although some multi-level memory systems include circuitry that tracks process or other variations and adjusts the threshold values accordingly, these systems output a value from a number of possible values that is equal to the number of levels in the multi-level system. Thus, for example, for a conventional four-level non-volatile memory, the sense amplifier will produce a data signal representing one of the four levels.

In contrast with conventional multi-level memory systems, embodiments of the present invention utilize a demodulator that produces an output having a number of possible values greater than the number of levels provided by the multi-level solid state non-volatile memory 314. This information is sometimes referred to as soft information since the output includes information in addition to the value stored in the multi-level memory. Merely by way of example, an analog-to-digital (A/D) converter or detector provided as part of or working in conjunction with demodulator 316 provides an output signal with, for example, 32 possible values in response to the values detected by a sense amplifier disposed in communication with, for example, a four-level memory. Embodiments of the present invention are not limited to using an output signal with 32 levels, as other output signals, with, for example, 8, 16, or more levels are included within the scope of the present invention. In some applications, the soft information is passed to a soft information decoder (not shown) for processing. In embodiments of the present invention, the soft information provided by the demodulator 316 is utilized during signal processing operations to improve the reliability with which data from the solid state non-volatile memory 314 is read.

In an embodiment of the present invention, encoder 310, modulator 312, demodulator 316, and decoder 318 are components of a controller in communication with multi-level solid state non-volatile memory 314. Memory devices typically include one or more memory chips that are mounted on a card. Each of the memory chips may include an array of memory cells as well as integrated circuits performing such operations as program, read, and erase. According to embodiments of the present invention, a controller circuit performing these operations may or may not be disposed in the integrated circuits (IC) in which the memory chip(s) are also disposed. Controllers provided herein are not limited to performing encoding/decoding and modulation/demodulation processes, but may also provide for other functionality such as wear leveling and interfacing processes.

Embodiments of the present invention enable system designers to increase the memory density of existing solid state non-volatile memories. As described more fully throughout the present specification, in comparison with conventional systems, increased levels of read and write errors are corrected utilizing the techniques and methods provided herein. Thus, although attempting to utilize, for example, a four-level memory system for, for example, eight-level applications by introducing additional levels may produce a greater number of errors during read operations than is otherwise acceptable under a given performance measure, techniques described herein may be utilized to correct such errors during the demodulation process and enable the use, for instance, of a four-level memory system in an eight-level application. Thus, in accordance with the present invention, the memory density of existing solid state non-volatile memory systems may be increased while still using some of the same components, including memory arrays, sense amplifiers, and the like.

Figure 3B:
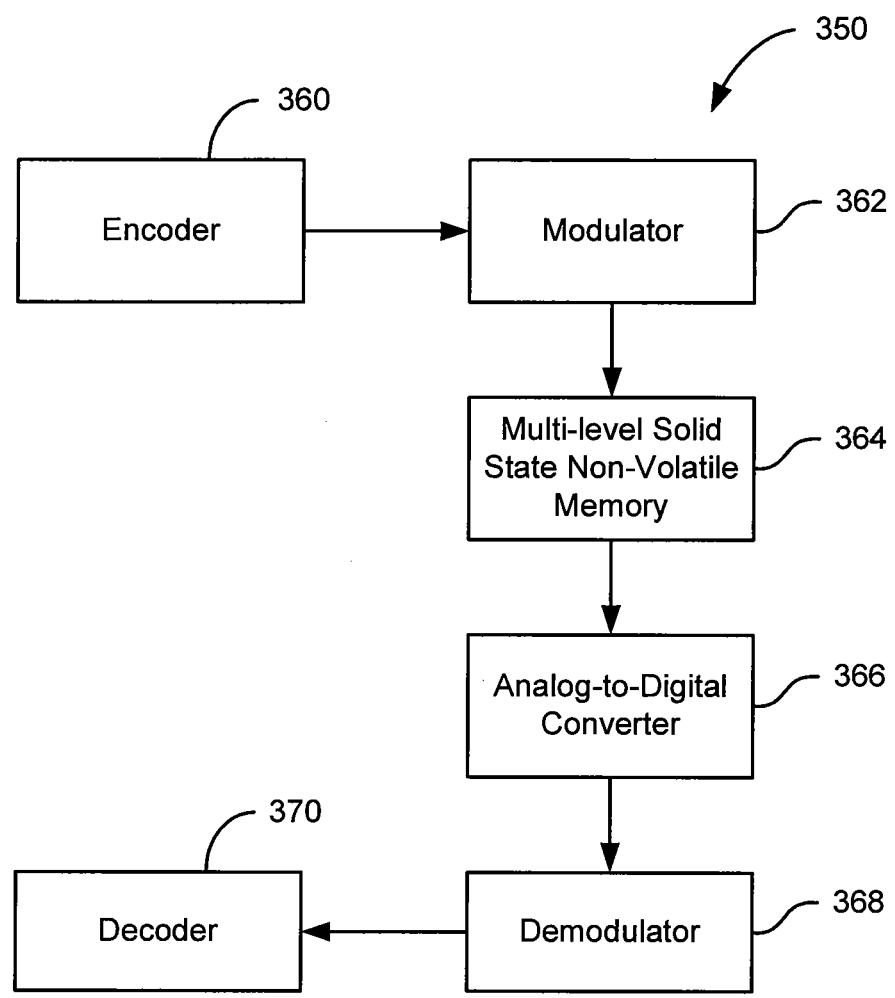
FIG. 3B is a simplified block diagram of a solid state non-volatile memory unit incorporating an analog-to-digital converter according to an embodiment of the present invention.

FIG. 3B is a simplified block diagram of a solid state non-volatile memory unit 350 incorporating an A/D converter according to an embodiment of the present invention. As illustrated in FIG. 3B, an encoder 360 and a modulator 362 provide encoded and modulated data to the multi-level non-volatile solid state memory 364. A/D converter 366 receives signals from the multi-level non-volatile solid state memory 364. The digital signal output by the A/D converter 366 is of higher resolution (characterized by more levels) than the number of levels associated with the multi-level non-volatile solid state memory 364. Merely by way of example, in a particular embodiment, the multi-level non-volatile solid state memory 364 is, for example, a four-level memory, providing storage for 2 bits in each cell. During a read operation, the A/D converter 366 converts an analog signal associated with one or more cells of the memory 364 into one of, for example, 8, 16, 32, or 64 levels depending on the particular application. Other numbers of levels greater than four levels are used in other embodiments. Signal processing algorithms resident in demodulator 368 utilize the output of the A/D converter 366 to determine the likelihood that the cell contains data associated with one of the four levels stored in the cell. One of ordinary skill in the art would recognize many variations, modifications, and alternatives.

In conventional solid state memories, ECC techniques are utilized to detect and correct errors in data as the data is read out from the memory. Such ECC techniques simply operate on binary or multi-level digital data produced by a sense amplifier. On the other hand, in accordance with the present invention, soft information produced and utilized by the demodulator 316 does not merely include the binary or multi-level digital data, but additional information as well. Soft information is typically represented by distributions that are useful in performing signal processing techniques not generally applicable once the data has been reduced to threshold-based digital values equal in number to the number of levels in the multi-level system.

Utilizing embodiments of the present invention, positive coding gain is achieved for multi-level solid state non-volatile memory systems in comparison to uncoded systems. Table 1 illustrates an exemplary coding gain from convolutional coded 2 bit/cell multi-level non-volatile memory over an uncoded 1 bit/cell non-volatile memory as a function of the number of states of the code. As shown in the first row entry, for a 4-state system (illustrated by FIGS. 2A-2C), the coding gain in comparison to an uncoded system is 0 dB. However, as the number of states is increased, the coding gain in comparison to an uncoded system is positive.

TABLE 1

| Number of States | Coding Gain (dB) |
|---|---|
| 4 | 0 |
| 8 | 0.46 |
| 16 | 0.87 |
| 32 | 1.50 |

Table 2 illustrates the coding gain for convolutional coded 3 bit/cell multi-level non-volatile memory over uncoded 2 bit/cell multi-level non-volatile memory as a function of the number of states of the code. As shown for 1 bit/cell multi-level non-volatile memory with four or more states, the coding gain in comparison to an uncoded system is positive for systems with four or more states.

TABLE 2

| Number of States | Coding Gain (dB) |
|---|---|
| 4 | 2.18 |
| 8 | 2.64 |
| 16 | 3.05 |
| 32 | 3.78 |

Figure 4:
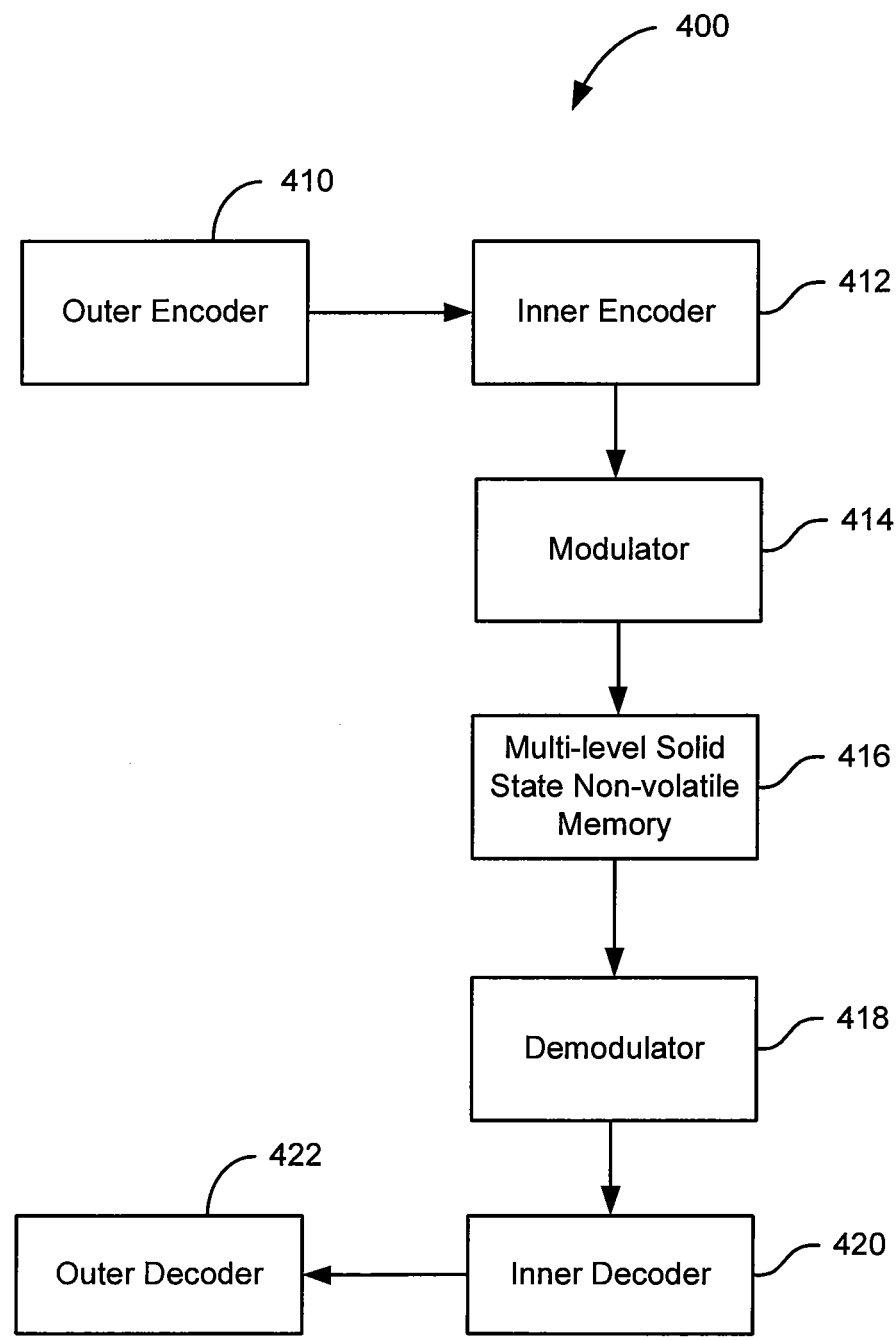
FIG. 4 is a simplified block diagram of a solid state non-volatile memory unit with error correction according to another embodiment of the present invention.

FIG. 4 is a simplified block diagram of a solid state non-volatile memory unit with error correction according to another embodiment of the present invention. As illustrated in FIG. 4, an outer encoder 410 provides encoded data to an inner encoder 412. As an example, outer encoder 410 may be a Reed-Solomon encoder and inner encoder may be an LDPC encoder. These encoding techniques are used merely as examples and are not intended to limit the scope of the present invention. One of ordinary skill in the art would recognize many variations, modifications, and alternatives. Modulator 414 receives encoded data from inner encoder 412 and modulates the data prior to storage in multi-level solid state non-volatile memory 416 during a program operation. During a read operation, the data stored in the multi-level solid state non-volatile memory 416 is retrieved and provided to demodulator 418, inner decoder 420, and outer decoder 422.

Any number of Error Correcting Codes (ECCs) including Forward Error Correction (FEC) codes may be used according to embodiments of the present invention to improve the bit error rate (BER) performance of power-limited and/or bandwidth-limited channels by adding structured redundancy to the transmitted data. For example, block codes may be used to encode a block of data for channels with additive burst noise (random multi-bit errors). It is understood that the present invention is applicable to both systematic encoders that do not manipulate the user data prior to encoding and storage, as well as to non-systematic encoders.

Figure 5:
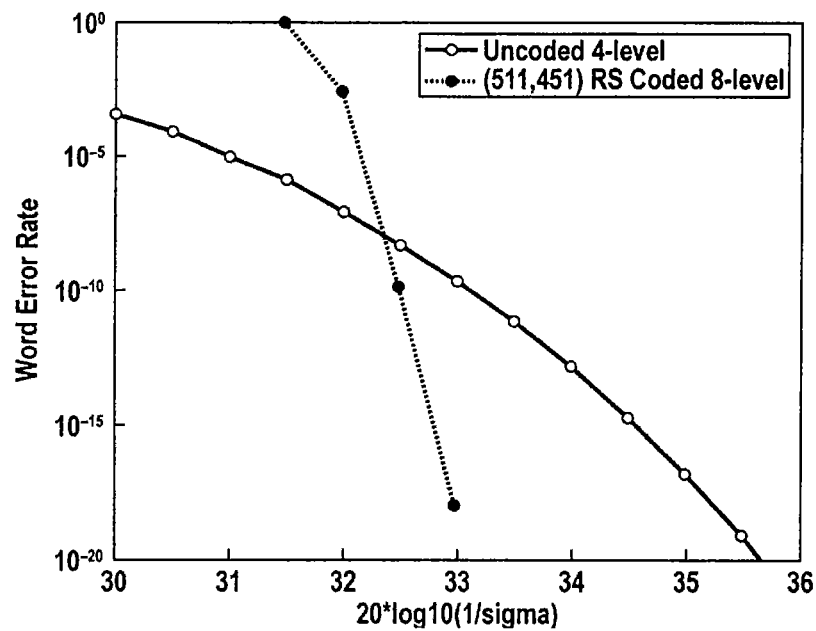
FIG. 5 shows a word error rate (WER) of a memory unit, in accordance with one exemplary embodiment of the present invention, as compared to a conventional uncoded system.

Any one of a number of different linear block codes including, for example, binary codes such as Hamming code, BCH code, Reed-Muller code and Array Code, and non-binary codes such as Reed-Solomon (RS) code may be used. Choice of block size depends on SNR and the code used. For example, assume that the voltage levels are increased from 4 to 8 per cell, and that each three cells are grouped together to form a 9-bit symbol. Applying a (511, 451) Reed-Solomon code, based on $GF(2^9)$, the codeword length is 511*9=4599 bits, and the code rate is 451/511~=0.883. Therefore, the storage capacity for the coded system is 3*451/511~=2.6 bits/cell, which represents a 32% capacity increase over uncoded 4-level system. The word error rate (WER) of such a coded system is compared to a 4-level uncoded system in FIG. 5. It can be seen at WER<$10^{-8}$, the RS coded system outperforms the uncoded system. Therefore, with the above RS code, better reliability and higher capacity is achieved.

In accordance with other exemplary embodiments of the present invention, for example, when the noise is independent from symbol to symbol, convolutional codes are used to encode the data. Convolutional codes introduce correlation into coded data and thus increase the minimum distance at the decoder. Convolutional codes are applied to serially-transmitted data stored in or read from solid state non-volatile memories, which are subject to Gaussian noise. Convolutional codes are progressive codes. At any point in time, the output of a convolutional encoder may depend upon both the past and present input values. Thus, convolutional codes are generally directed to correcting errors that span an ordered progression of data values. Accordingly, such codes may be used in multi-level solid state non-volatile memories that store and read out data in the form of an ordered, progressive stream (i.e., a data stream).

Figure 6:
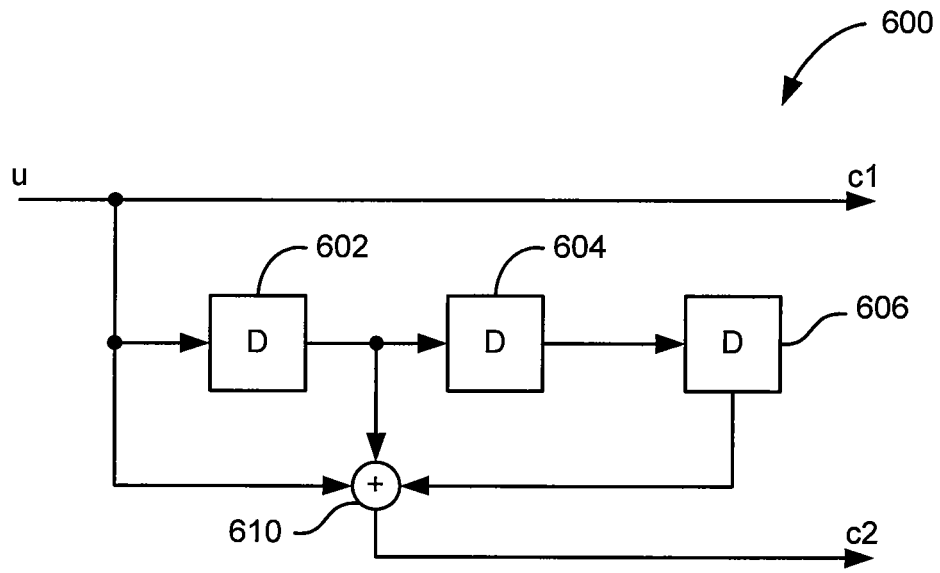
FIG. 6 shows various blocks of an exemplary rate 1/2 convolutional encoder according to an embodiment of the present invention.

The decoder receives either hard decision inputs or multi-level quantized inputs. Soft inputs are known to cause fewer errors at the detector. FIG. 6 shows various blocks of an exemplary rate 1/2 convolutional encoder 600. Output C2 generated by modulo-2 adder 610 is defined by shift registers 602, 606 and input U. For example, if the voltage levels are increased from four to eight, applying a rate 3/4 convolutional code to get 3*3/4=2.25 bits/cell, results in a 10% increase in storage capacity. To achieve the same error rate as uncoded 4-level system, the free distance of the convolutional code must be greater than $(7/3)^2$=5.44. A 3/4 convolutional encoder with six memory units would require a Viterbi decoder with $2^6$=64 states.

Figure 7:
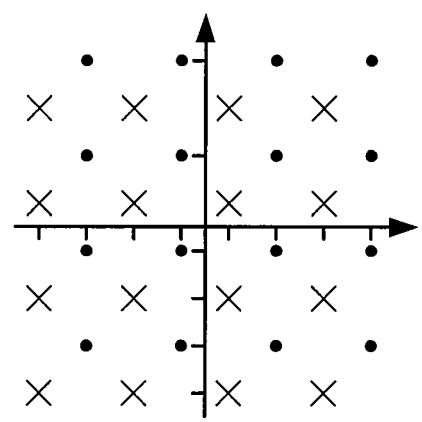
FIG. 7 shows an example of 2-D set partitioning according to an embodiment of the present invention.

Trellis coded modulation (TCM) combines convolutional code with set partitioning to achieve high code rate, high coding gain, and low decoding complexity. A set of constellation points can be partitioned to a smaller subset, where points in each subset are separated further than in the original constellation. FIG. 7 shows an example of 2-D set partitioning where dots, "o", represent one subset, and crosses, "x", represent the other. If the minimum distance between the original constellation points is d, then the minimum distance between points in each subset is $\sqrt{2}d$. In systems with additive white Gaussian Noise (AWGN) channels, such as flash memory systems read path channels, the parameter governing the performance of the system is not the free Hamming distance of the convolutional code, but rather the free Euclidean distance between the transmitted signal sequences. Accordingly, the optimization of the TCM design is based on the Euclidean distances rather than the Hamming distances.

Figure 8:
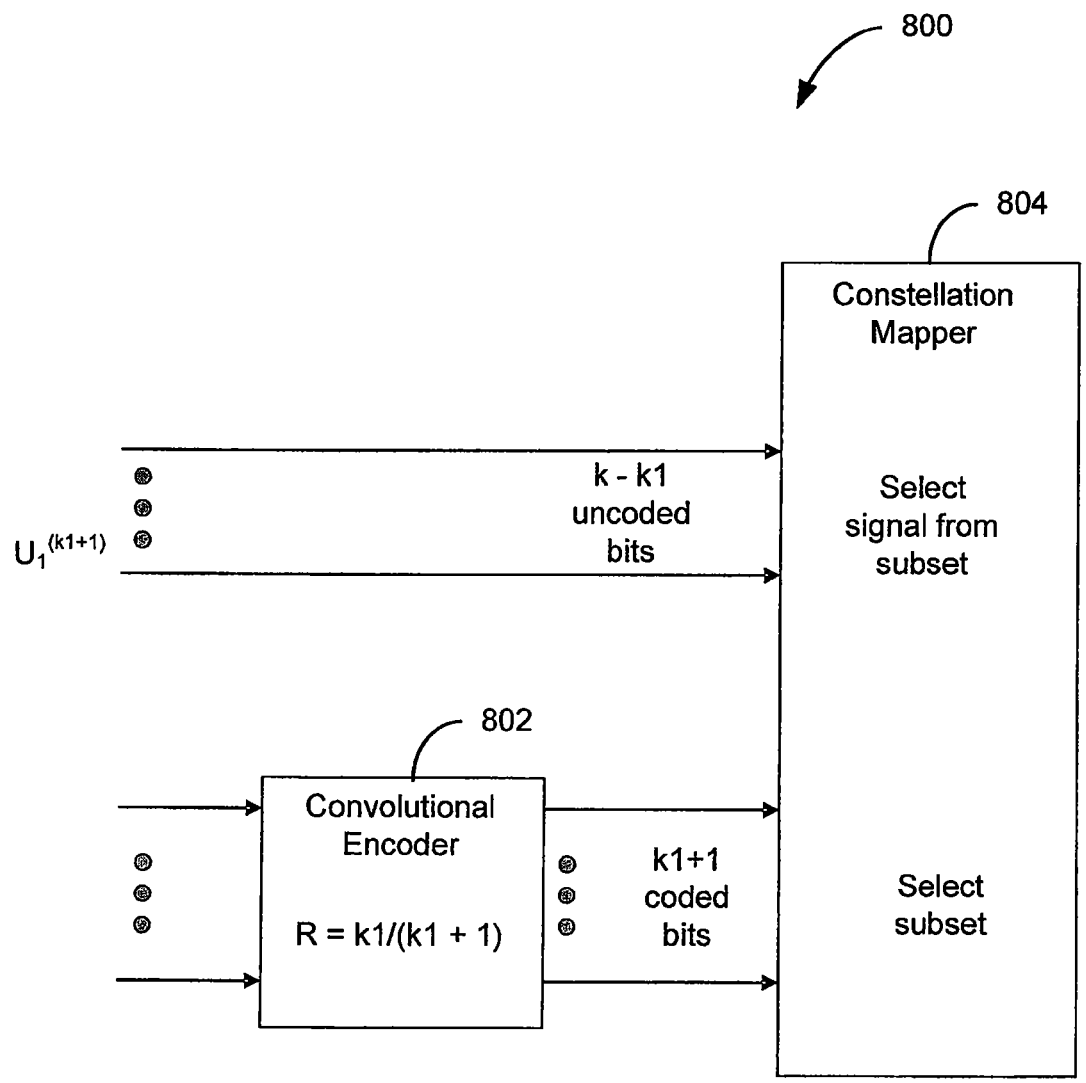
FIG. 8 is a simplified block diagram of a conventional TCM encoder.

An example of TCM is shown in FIG. 8. Input bits are separated into two groups—a first group with $k_1$ bits, going through a rate $k_1/(K_1+1)$ encoder 802 to select subsets; a second group with $k-k_1$ bits, which select constellation points, using constellation mapper 804, within each subset. Below is a description of an exemplary increase in capacity from 2 bits/cell to 2.5 bits/cell. Assume that there are 8 voltage levels and that each two adjacent cells is combined to form a 64 QAM constellation. The 64 QAM is partitioned into 4 cosets. Distance between any two points in each coset is 8*d0. Assume a rate 3/4 convolutional code is used to select a coset, and two uncoded bits are used to select a point within any given coset. The overall code rate would thus become 5/6, leading to 2.5 bits/cell. The overall coding gain is 0.43 dB. Therefore, such a TCM coded system has a better performance than the uncoded 4 level system while increasing the storage capacity by 25%.

Some codes based on random construction may be effectively decoded by iterative detection methods. These codes include Turbo codes, i.e., serially concatenated convolutional codes, or parallel concatenated convolutional codes, low-density parity-check (LDPC) codes, Turbo Product code, and their variations.

Figure 9:
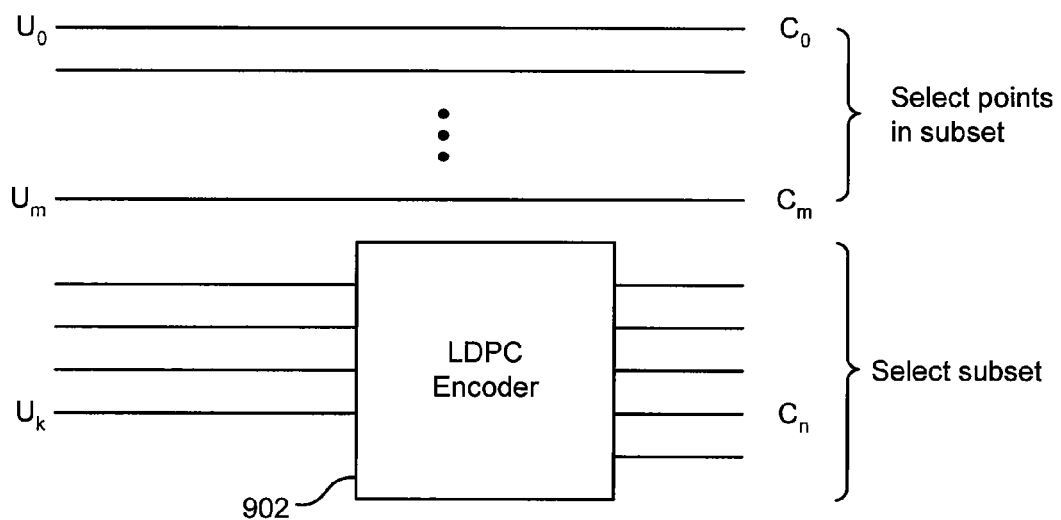
FIG. 9 illustrates an example of combining set-partitioning with iterative code according to an embodiment of the present invention.

Coding gain of TCM comes from two areas—set partitioning to increase the distance between constellation points within each subset, and convolutional code to achieve high Euclidean distance between different subsets, the latter of which can also be achieved if other high gain codes are substituted for convolutional code. An example of combining set-partitioning with iterative code is shown in FIG. 9. Assume a 16-PAM system is partitioned into 4 subsets. Then the minimum distance between points in each subset is $4d_0$, hence providing a 12 dB gain compared to uncoded system. However, between different subsets, the minimum distance remains at $d_0$. Since the selection of subset depends on LDPC coded bits supplied by LDPC encoder 902, then the overall system has an approximate gain of 12 dB if an LDPC code having a gain of 12 dB is used. In general, the overall system gain is the minimum of the set-partitioning gain and the iterative coding gain. LDPC encoder 902 shown in FIG. 9 is required to operate on a whole codeword defined by the iterative code block size. In addition to iterative codes, other high gain codes including RS code and BCH code may be used to code a portion of the input for subset selection.

Figure 10A:
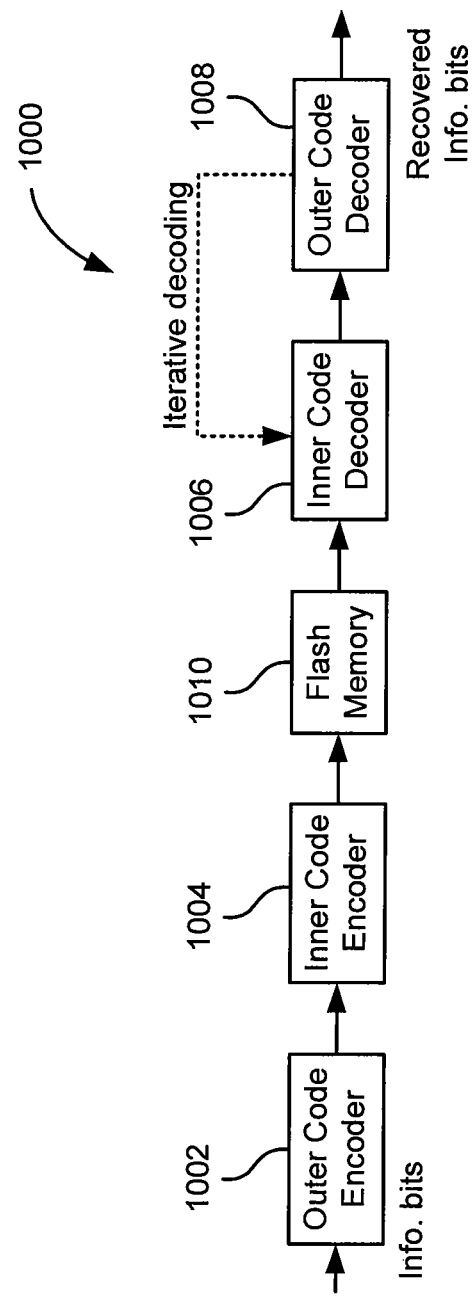
FIG. 10A is a simplified illustration of a two-level system that includes an inner code and an outer code according to an embodiment of the present invention.

In accordance with some embodiments, to further improve coding gain, multi-level coding may be used. A two-level encoding that includes an inner encoder and an outer encoder is shown in FIG. 10A. In one exemplary embodiment, outer code encoder 1002 may be a RS encoder, and inner code encoder 1004 may be a TCM encoder. Bursty errors caused by TCM decoder 1006 are corrected by RS decoder 1008.

In another exemplary embodiment, inner encoder 1004 is adapted to perform iterative codes, such as LDPC codes or Turbo codes, and outer encoder 1002 is adapted to perform RS code. Iterative codes may be binary codes or symbol-based codes. Each symbol may contain multiple bits. Iterative codes may be decoded using a soft-input soft-output (SISO) decoder, while RS codes may be decoded using either a SISO or a hard-decision decoder. The outer RS decoder 1008 may iterate with inner decoder 1006 to exchange soft information. Such iteration would improve the quality of soft information and thereby decrease the number of bit errors after each iteration.

The descriptions of the various embodiments provided herein are provided merely by way of example, and are not intended to limit the scope of the present invention. Various other coding techniques, interleaving techniques, modulation techniques, demodulation techniques, decoding techniques, mapping techniques, and the like are included within the scope of the present invention.

Figure 10B:
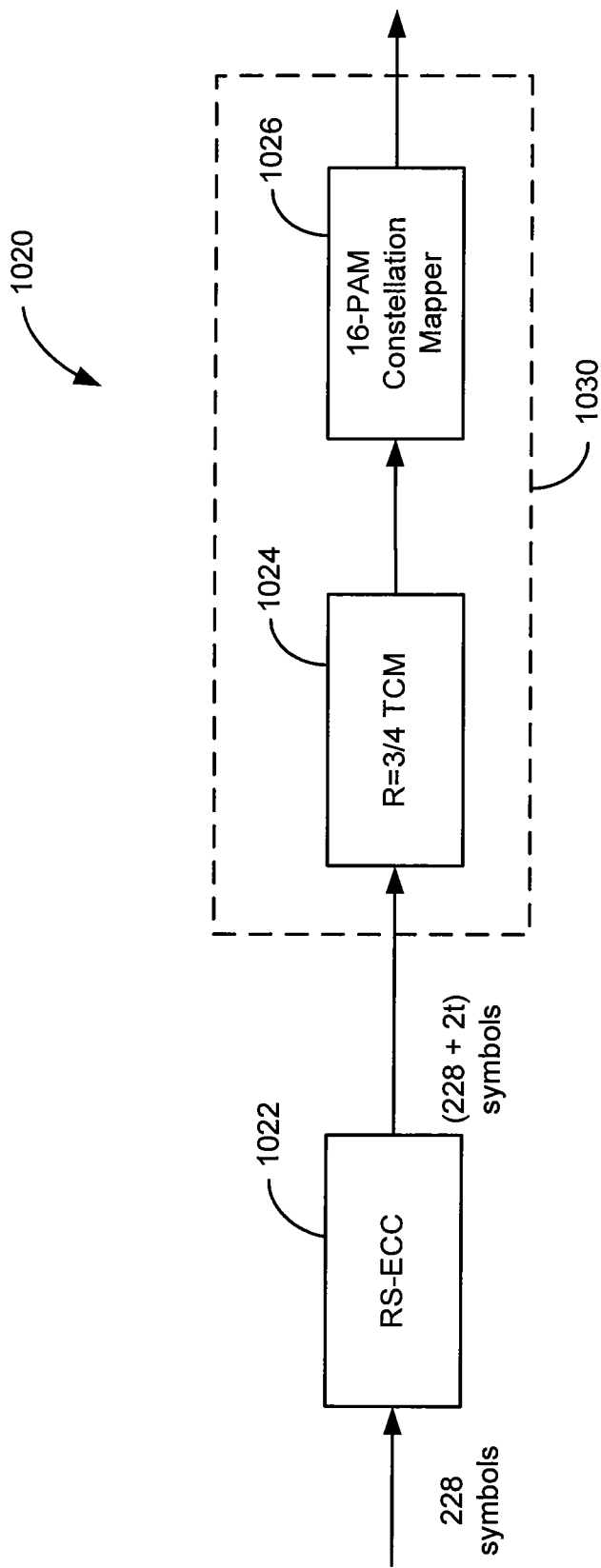
FIG. 10B is a simplified block diagram of a two-level encoding channel according to another exemplary embodiment of the present invention.

FIG. 10B is a simplified block diagram of a two-level encoding 1020, in accordance with another exemplary embodiment of the present invention. The outer encoder 1022 is a Reed-Solomon encoder with a correction power t. Inner encoder 1030 includes a TCM 1024 having a code rate 3/4, and a 16-PAM constellation mapper 1026 having a spacing between any two points of 2/15. For calculations performed for the encoding channel shown in FIG. 10B, convolutional encoders with polynomials of order 3, 4, and 5 are utilized. It is understood that although the exemplary embodiment shown in FIG. 10B includes a Reed-Solomon encoder 1022, a TCM 1024, and a 16-PAM constellation mapper 1026, other embodiments of the present invention may include other encoders, modulators, and mappers. Moreover, for all the exemplary embodiments described herein and shown in the drawings, modulators including multi-dimensional ones such as those proposed by Wei, "Trellis-Coded Modulation with Multidimensional Constellations" IEEE Transactions on Information Theory, Volume IT-33, No. 4, (July 1987), pgs. 483-501; and multilevel codes such as those proposed by Imai and Hirakawa, "A New Multilevel Coding Method Using Error-Correcting Codes" IEEE Transactions on Information Theory, Volume IT-23, No. 3, (May 1977) pgs. 371-377, any combinations thereof, and the like may be used.

Referring to FIG. 10B, approximately 2 kbits (2048 bits) are represented by 228 9-bit symbols. Merely by way of example, the 9-bit symbols are formed by combining three adjacent 8-level cells. The 228 9-bit symbols are supplemented with 2t symbols by the Reed-Solomon encoder 1022 to provide 230 symbols that are input to the inner encoder 1030. In an exemplary embodiment, user data represented by the 228 9-bit symbols is written into a portion of a memory array characterized by a width equal to thirty 3-bit cells. After the user data is written into the memory array in a serial manner, three adjacent 3-bit cells are grouped to form a 9-bit symbol. The ten columns of such 9-bit symbols are then appended with column parity values provided, for example, by the RS encoder 1022. The number of appended parity values will depend, in part, on the correction power selected for the RS encoder 1022. TCM encoding is performed on each 3-bit cell to provide encoded 4-bit symbols, which are subsequently provided to the 16-PAM constellation mapper 1026 and then written to the solid state non-volatile memory. It will be appreciated that encoding may also be performed in parallel, for example, by providing a number of TCMs 1024 operating in parallel, thereby increasing the processing speed. Decoding of user data is performed by reversing the operations discussed in relation to FIG. 10B.

Depending on the encoding technique selected, one of several generator polynomials may be used. Merely by way of example, generator polynomials as illustrated in Table 3 are used with systematic encoders with a rate 1/2 code for some applications. The number of branches per state is equal to two.

TABLE 3

| Generator Polynomials | |
|---|---|
| Order | Polynomial |
| 2 | $[1\ D/D^2 + 1]$ |
| 3 | $[1\ D^2/D^3 + D + 1]$ |
| 4 | $[1\ D^2/D^4 + D + 1]$ |
| 5 | $[1\ D^2/D^5 + D^2 + 1]$ |

Set partitioning for Level 1 is:
Q(0)—{−15,−11,−7,−3,+1,+,5+9,+13}
Q(1)—{−13,−9,−5,−1,+3,+7,+11,+15}
Set partitioning for Level 2 is:
Q(00)—{−15,−7,+1,+9},
Q(10)—{−11,−3,+5,+13}
Q(01)—{−13,−5,+3,+11}
Q(11)—{−9,−1,+7,+15}

As illustrated in FIG. 10B, some embodiments of the present invention utilize an RS encoder as outer encoder 1022. RS encoders provide a functionality of being well suited for applications in which bursts of errors are present. For solid state non-volatile memory applications, errors may occur in bursts for several reasons. First, defects in a portion of a memory array media may impact the error caused by the cells disposed in such portions. Additionally, error bursts may result from operation of the inner encoder 1024. A convolutional decoder may produce bursts of errors since the output at any given time depends, in part, on previous outputs. Thus, some embodiments of the present invention utilize RS encoders and decoders suited for handling error bursts.

Figure 1:
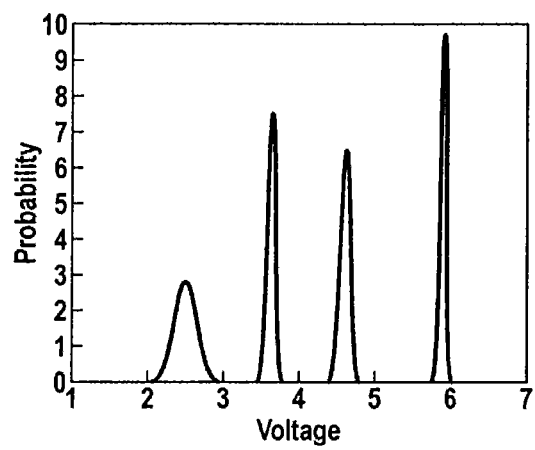
FIG. 1 is a simplified probability distribution function as a function of voltage for a solid state non-volatile memory cell having a 4-level quantization.

As seen from FIG. 1, the PDF of the programmed cells is different depending on the cell's threshold voltage. If the four levels are spaced equally, then the level corresponding to cells with a PDF defined by a threshold voltage ranging between 2 and 4 volts is more prone to errors than other levels due to its wider distribution. Accordingly, in some embodiments, constrained coding is used to inhibit certain patterns or reduce their frequency. For example, lowering the frequency of data corresponding to cells with a PDF defined by a threshold voltage ranging between 2 and 4 volts lowers the overall error probability.

Figure 11A:
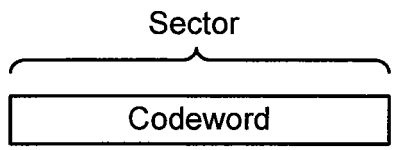
FIGS. 11A-11C show a number of exemplary sector and codeword sizes, in accordance with the present invention.
Figure 11B:
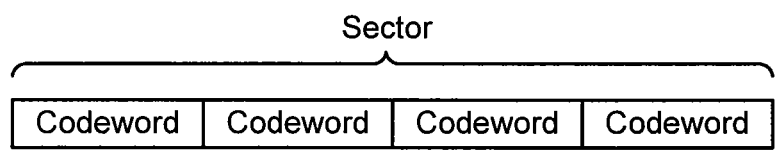
Figure 11C:
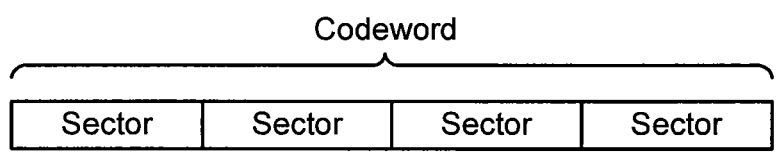

In some embodiments, the codeword size is aligned with the sector size. For example, if the sector size is, for example, 256 kbits, the inner code and outer code may be configured such that one outer codeword is 256 kbits. Smaller or larger codeword sizes relative to the sector size may also be used. In FIG. 11A, the sector size is shown as being equal to the codeword size. In the case of smaller codeword size, each sector includes several codewords, as shown in FIG. 11B. In the case of larger codeword size, each codeword includes several sectors, as shown in FIG. 11C. In general, the larger the codeword size, the larger the coding gain, the longer decoding delay, and the higher is the decoder complexity.

Figure 12:
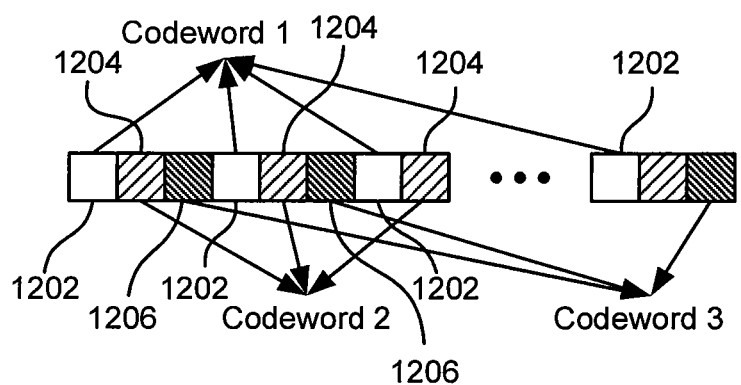
FIG. 12 illustrates an exemplary 3-way interleaved cell according to an embodiment of the present invention.

Codewords may be interleaved before being stored. FIG. 12 shows an exemplary 3-way interleaved cell in which cells 1202 form codeword 1, cells 1204 form codeword 2, and cells 1206 form codeword 3. If a defect spans no more than three cells, it causes only one symbol error in each codeword, which is easier to correct than a burst of three symbol errors.

In accordance with other exemplary embodiments of the present invention, coding of data, as described above may be applied across a multitude of non-volatile solid-state semiconductor memories, that in some embodiments are physically stacked on top of one another. For example, if 8 such non-volatile solid-state semiconductor memories are stacked together, a $GF(2^8)$-based RS code may be applied across these memories, where each bit of a RS code symbol comes from one of these memories. Coding across such memories improves error recovery in the event one of these memories has large defects.

Figure 13A:
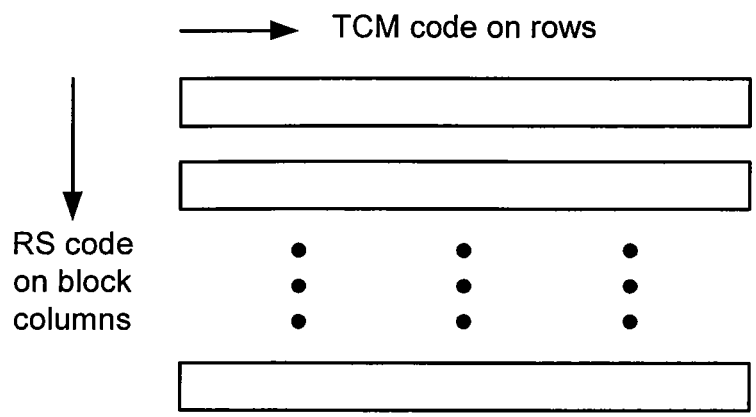
FIG. 13A is a simplified schematic diagram of an interleaving technique provided according to an exemplary embodiment of the present invention.

FIG. 13A is a simplified schematic diagram of an interleaving technique provided according to an exemplary embodiment of the present invention. As illustrated in FIG. 13A, an inner encoder, for example, a TCM encoder, is utilized on rows of data and an outer encoder, for example, an RS encoder, is utilized on block columns of data. This exemplary embodiment may be used, for example, in solid state non-volatile memories, in which the data is written to the memory cells in a rectangular format, i.e., blocks. In situations in which a multi-bit error of significant length is present on the inner TCM code, embodiments of the present invention provide that several independent outer RS codes process data corrupted by the multi-bit error. Accordingly, the number of errors impacting an individual RS code is limited. Referring to FIG. 13A, the number of columns in a particular implementation is determined, in part, by the maximum error burst length. The number of rows is determined, in part, by the number of sectors per block codeword.

According to some embodiments of the present invention, the number of columns is predetermined depending on the particular application. For example, if the number of columns (related to the interleaving depth) is larger than the maximum error burst length, then the outer encoder operating on the columns is similar to a memoryless channel characterized by a particular symbol error rate. Accordingly, error bursts that occur affect different outer encoder codes. The symbol error rate is typically determined by using TCM simulations independently, and the error probability may be estimated by independent modeling. The percentage of overhead of the outer encoder, for example, an RS encoder, may be reduced by increasing the row dimension of the block codeword. Alternatively, one can increase the row dimension of the RS code while keeping the overhead percentage constant, thereby allowing for a higher correction power per column.

Figure 13B:
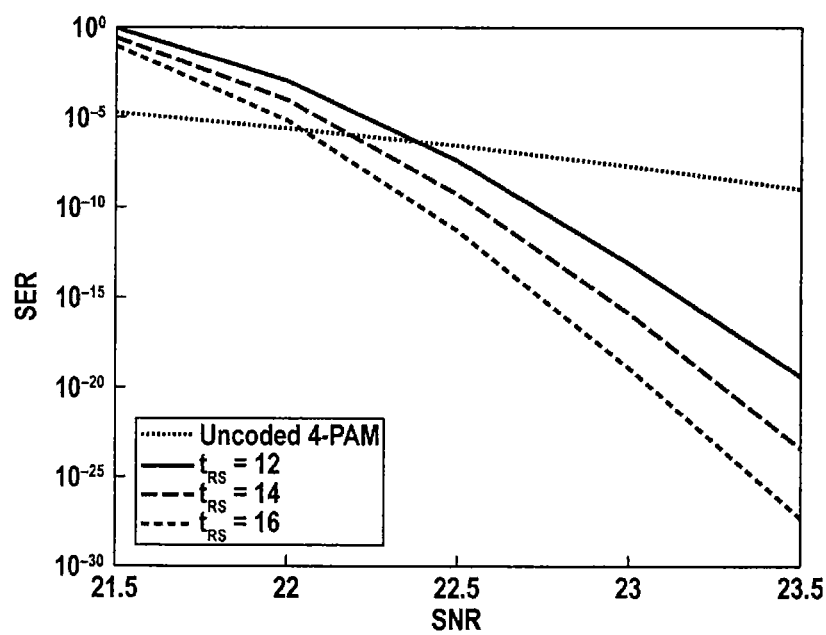
FIG. 13B is a plot of SER as a function of SNR for an interleaved system as illustrated in FIG. 13A.

FIG. 13B is a plot of SER as a function of SNR for an interleaved system as illustrated in FIG. 13A. To compute the data presented in FIG. 13B, 10 columns and 10 sectors per block codeword were utilized. Other embodiments will utilize a varying number of columns and sectors per block codeword depending on the particular application. The SER for an uncoded 2 bits/cell 4-PAM system is illustrated for purposes of comparison. The SER values for implementations in which the strength of the outer encoder (an RS encoder in this example) is varied over a range of correction powers are shown ($t_{RS}$=12, 14, and 16, respectively). As the correction power or strength of the outer encoding increases, the SNR at which the coded system drops to a level equal to the uncoded system decreases. Referring to FIG. 13B, this cross-over point is at approximately 22.4 dB, 22.2 dB, and 22.0 dB for $t_{RS}$=12, 14, and 16, respectively.

In a particular exemplary embodiment, a multi-level solid state non-volatile memory includes, for example, 2.5 bits/cell. In such embodiments, two adjacent 8-level cells (3 bits/cell) form a 64-QAM modulation symbol. Of the six bits in the 64-QAM modulation symbol, five bits are utilized for data and one bit is used for encoding. Thus, in such exemplary embodiments, the code rate is 5/6 and the number of branches per state is equal to four. Such a system provides 2.5 bits/cell as 5 data bits are stored between two adjacent cells. In such exemplary embodiments, the coding gain in comparison with an uncoded 4-PAM system may be, for example, 0.423 dB for 16 states. It should be noted that calculation results will be modified as multiplicities are included in such calculations. For example, losses of approximately 0.2 dB are expected with the doubling of multiplicities. One of ordinary skill in the art would recognize many variations, modifications, and alternatives.

In another particular exemplary embodiment of the present invention, multi-level solid state non-volatile memory systems with, for example, 3.5 bits/cell are provided. In such embodiments, two adjacent 16-level cells (4 bits/cell) form a 256-QAM modulation symbol. Of the eight bits in the 256-QAM modulation symbol, seven bits are utilized for data and one bit is used for encoding. Thus, in such exemplary embodiments the code rate is 7/8 and the number of branches per state is equal to four. Such a system provides 3.5 bits/cell as 7 data bits are stored between two adjacent cells. The coding gain in comparison with an uncoded 8-PAM system may be, for example, 0.527 dB for 8 states and 1.317 dB for 16 states. It should be noted that calculation results will be modified as multiplicities are included in such calculations. For example, losses of approximately 0.2 dB are expected with the doubling of multiplicities. One of ordinary skill in the art would recognize many variations, modifications, and alternatives.

Figure 14A:
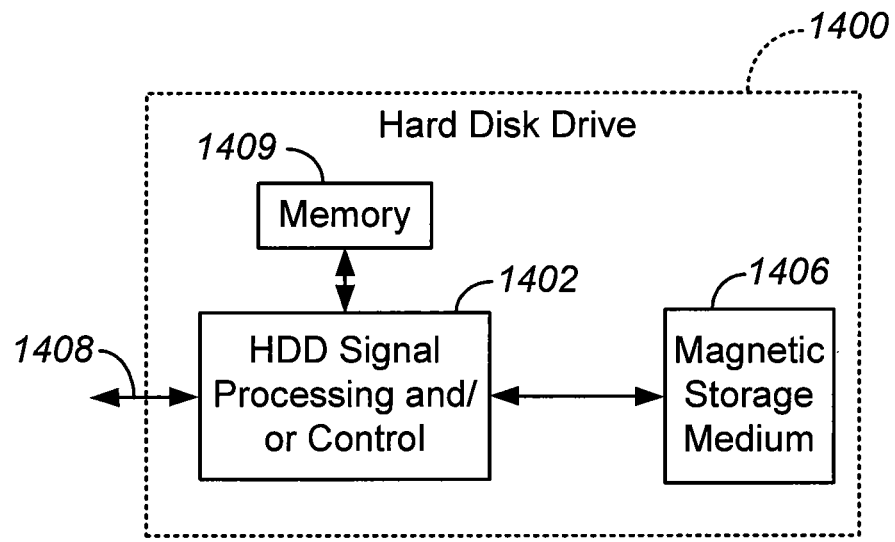
FIGS. 14A-14H show various devices in which the present invention may be embodied.

Referring now to FIGS. 14A-14G, various exemplary implementations of the present invention are shown. Referring to FIG. 14A, the present invention may be embodied in a hard disk drive 1400. The present invention may implement either or both signal processing and/or control circuits, which are generally identified in FIG. 14A at 1402. In some implementations, signal processing and/or control circuit 1402 and/or other circuits (not shown) in HDD 1400 may process data, perform coding and/or encryption, perform calculations, and/or format data that is output to and/or received from a magnetic storage medium 1406.

HDD 1400 may communicate with a host device (not shown) such as a computer, mobile computing devices such as personal digital assistants, cellular phones, media or MP3 players and the like, and/or other devices via one or more wired or wireless communication links 1408. HDD 1400 may be connected to memory 1409, such as random access memory (RAM), a low latency nonvolatile memory such as flash memory, read only memory (ROM) and/or other suitable electronic data storage.

Figure 14B:
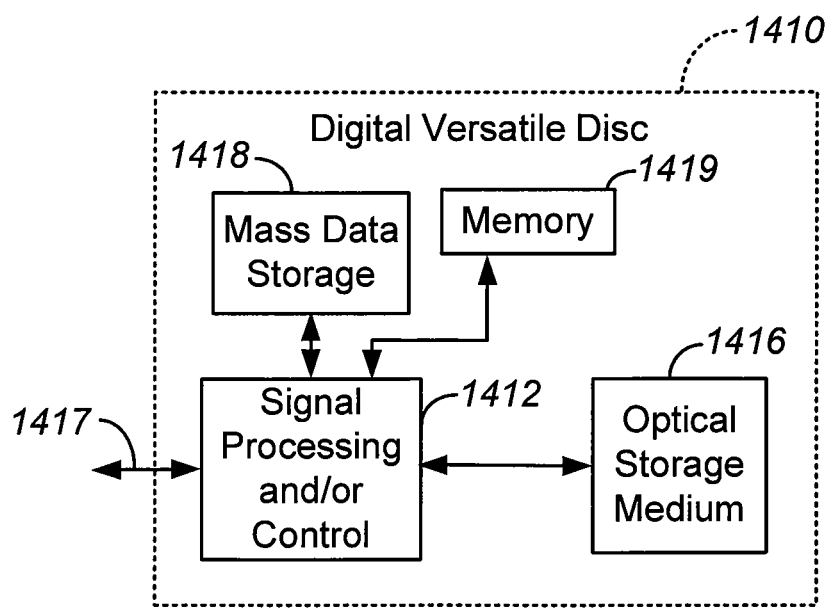

Referring now to FIG. 14B, the present invention may be embodied in a digital versatile disc (DVD) drive 1410. The present invention may implement either or both signal processing and/or control circuits, which are generally identified in FIG. 14B at 1412, and/or mass data storage 1418 of DVD drive 1410. Signal processing and/or control circuit 1412 and/or other circuits (not shown) in DVD drive 1410 may process data, perform coding and/or encryption, perform calculations, and/or format data that is read from and/or data written to an optical storage medium 1416. In some implementations, signal processing and/or control circuit 1412 and/or other circuits (not shown) in DVD drive 1410 can also perform other functions such as encoding and/or decoding and/or any other signal processing functions associated with a DVD drive.

DVD drive 1410 may communicate with an output device (not shown) such as a computer, television or other device via one or more wired or wireless communication links 1417. DVD drive 1410 may communicate with mass data storage 1418 that stores data in a nonvolatile manner. Mass data storage 1418 may include a hard disk drive (HDD) such as that shown in FIG. 14A. The HDD may be a mini HDD that includes one or more platters having a diameter that is smaller than approximately 1.8". DVD drive 1410 may be connected to memory 1419, such as RAM, ROM, low latency nonvolatile memory such as flash memory, and/or other suitable electronic data storage.

Figure 14C:
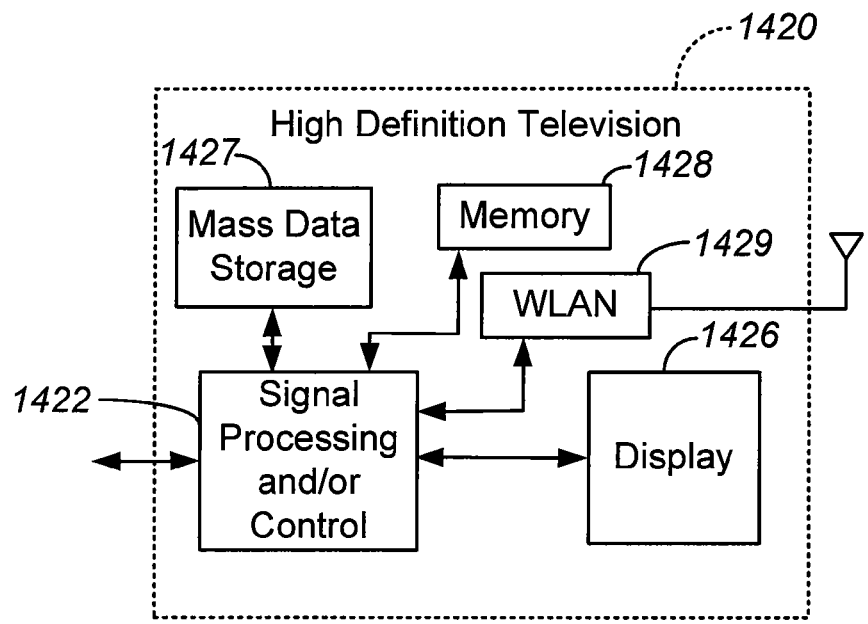

Referring now to FIG. 14C, the present invention may be embodied in a high definition television (HDTV) 1420. The present invention may implement either or both signal processing and/or control circuits, which are generally identified in FIG. 14C at 1422, a WLAN interface and/or mass data storage of the HDTV 1420. HDTV 1420 receives HDTV input signals in either a wired or wireless format and generates HDTV output signals for a display 1426. In some implementations, signal processing circuit and/or control circuit 1422 and/or other circuits (not shown) of HDTV 1420 may process data, perform coding and/or encryption, perform calculations, format data and/or perform any other type of HDTV processing that may be required.

HDTV 1420 may communicate with mass data storage 1427 that stores data in a nonvolatile manner such as optical and/or magnetic storage devices. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". HDTV 1420 may be connected to memory 1428 such as RAM, ROM, low latency nonvolatile memory such as flash memory and/or other suitable electronic data storage. HDTV 1420 also may support connections with a WLAN via a WLAN network interface 1429.

Figure 14D:
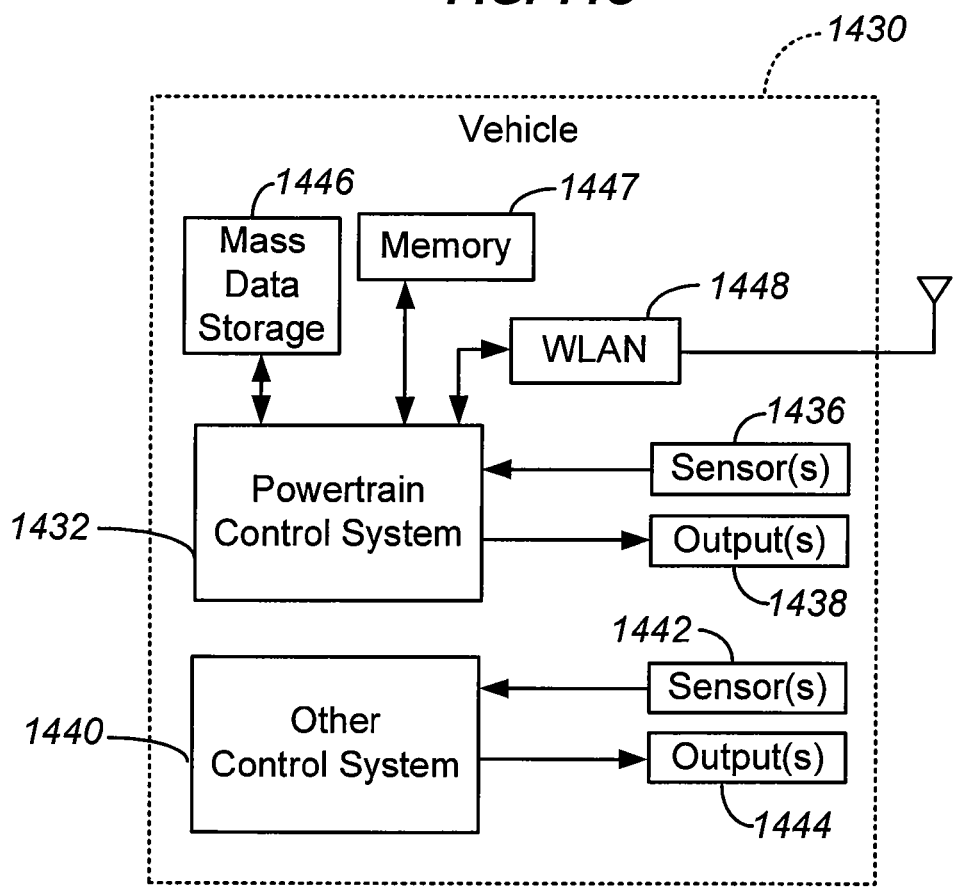

Referring now to FIG. 14D, the present invention may be embodied in a control system, a WLAN interface and/or mass data storage of a vehicle 1030. In some implementations, the present invention implements a powertrain control system 1432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control system 1440 of vehicle 1430. Control system 1440 may likewise receive signals from input sensors 1442 and/or output control signals to one or more output devices 1444. In some implementations, control system 1440 may be part of an anti-lock braking system (ABS), a navigation system, a telematics system, a vehicle telematics system, a lane departure system, an adaptive cruise control system, a vehicle entertainment system such as a stereo, DVD, compact disc system and the like. Still other implementations are contemplated.

Powertrain control system 1432 may communicate with mass data storage 1446 that stores data in a nonvolatile manner. Mass data storage 1446 may include optical and/or magnetic storage devices for example HDDs and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". Powertrain control system 1432 may be connected to memory 1447 such as RAM, ROM, low latency nonvolatile memory such as flash memory and/or other suitable electronic data storage. Powertrain control system 1432 also may support connections with a WLAN via a WLAN network interface 1448. The control system 1440 may also include mass data storage, memory and/or a WLAN interface (all not shown).

Figure 14E:
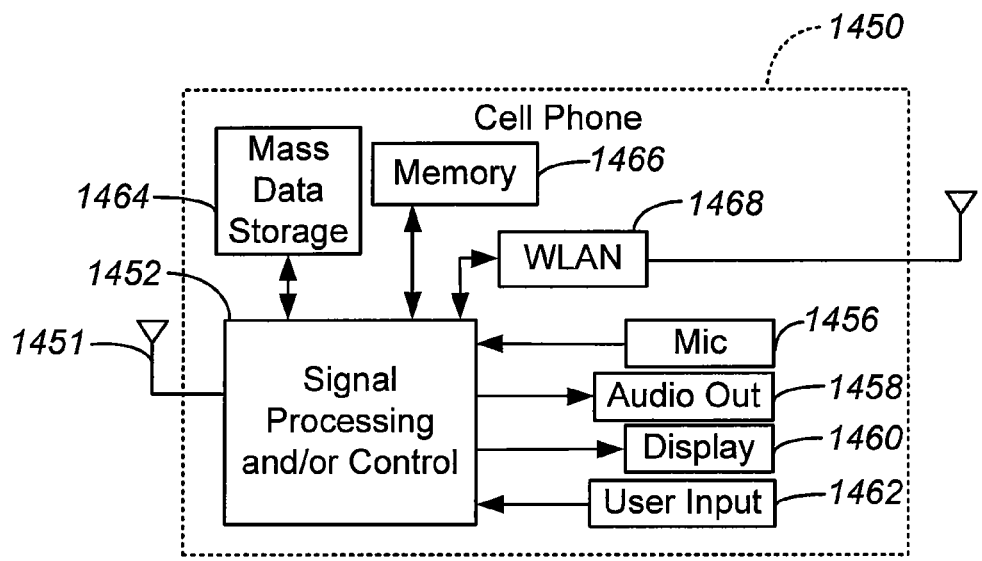

Referring now to FIG. 14E, the present invention may be embodied in a cellular phone 1450 that may include a cellular antenna 1451. The present invention may implement either or both signal processing and/or control circuits, which are generally identified in FIG. 14E at 1452, a WLAN interface and/or mass data storage of the cellular phone 1450. In some implementations, cellular phone 1450 includes a microphone 1456, an audio output 1458 such as a speaker and/or audio output jack, a display 1460 and/or an input device 1462 such as a keypad, pointing device, voice actuation and/or other input device. Signal processing and/or control circuits 1452 and/or other circuits (not shown) in cellular phone 1450 may process data, perform coding and/or encryption, perform calculations, format data and/or perform other cellular phone functions.

Cellular phone 1450 may communicate with mass data storage 1464 that stores data in a nonvolatile manner such as optical and/or magnetic storage devices for example HDDs and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". Cellular phone 1450 may be connected to memory 1466 such as RAM, ROM, low latency nonvolatile memory such as flash memory and/or other suitable electronic data storage. Cellular phone 1450 also may support connections with a WLAN via a WLAN network interface 1468.

Figure 14F:
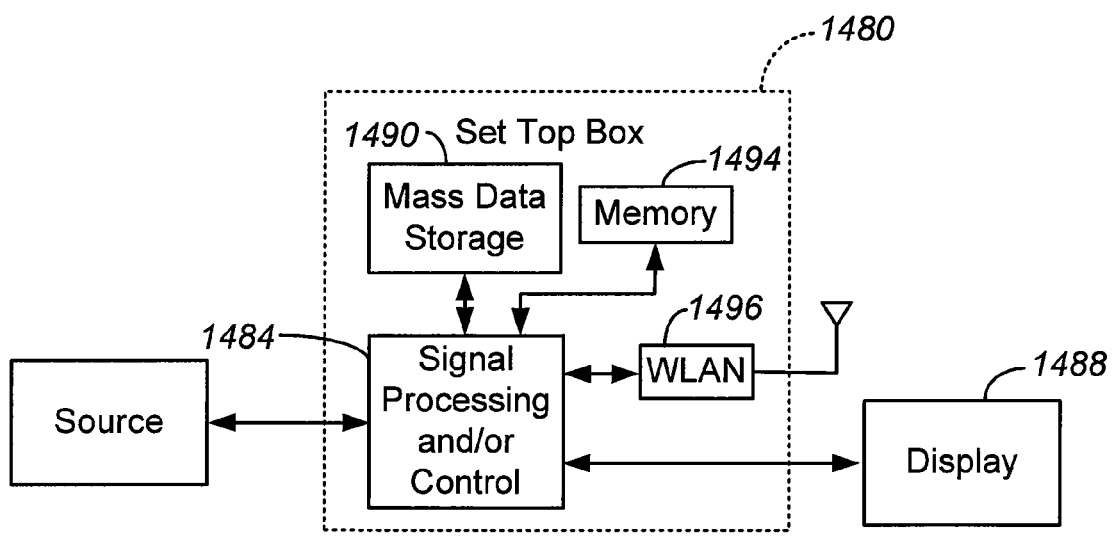

Referring now to FIG. 14F, the present invention may be embodied in a set top box 1480. The present invention may implement either or both signal processing and/or control circuits, which are generally identified in FIG. 14F at 1484, a WLAN interface and/or mass data storage of the set top box 1480. Set top box 1480 receives signals from a source such as a broadband source and outputs standard and/or high definition audio/video signals suitable for a display 1488 such as a television and/or monitor and/or other video and/or audio output devices. Signal processing and/or control circuits 1484 and/or other circuits (not shown) of the set top box 1480 may process data, perform coding and/or encryption, perform calculations, format data and/or perform any other set top box function.

Set top box 1480 may communicate with mass data storage 1490 that stores data in a nonvolatile manner. Mass data storage 1490 may include optical and/or magnetic storage devices for example HDDs and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". Set top box 1480 may be connected to memory 1494 such as RAM, ROM, low latency nonvolatile memory such as flash memory and/or other suitable electronic data storage. Set top box 1480 also may support connections with a WLAN via a WLAN network interface 1496.

Figure 14G:
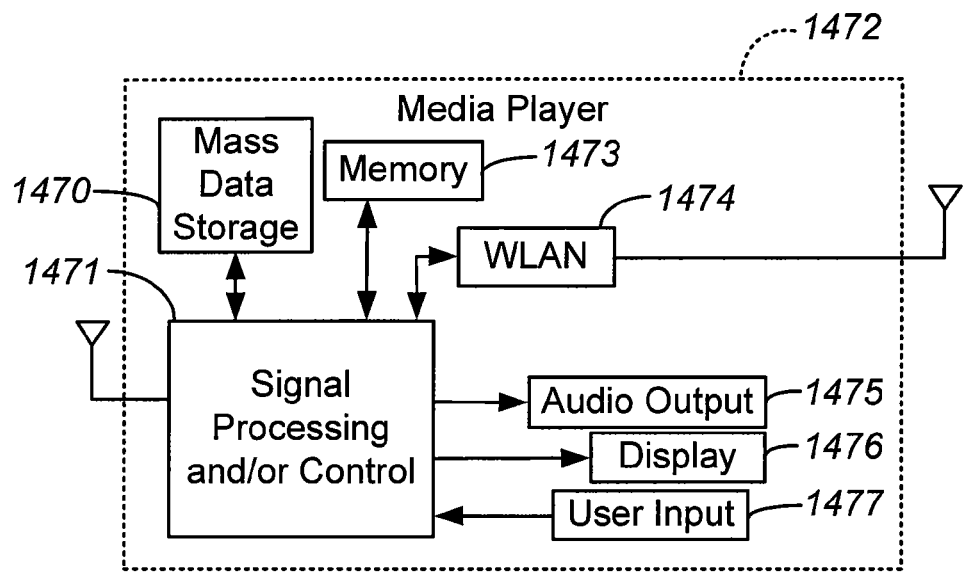

Referring now to FIG. 14G, the present invention may be embodied in a media player 1472. The present invention may implement either or both signal processing and/or control circuits, which are generally identified in FIG. 14G at 1471, a WLAN interface and/or mass data storage of the media player 1472. In some implementations, media player 1472 includes a display 1476 and/or a user input 1477 such as a keypad, touchpad and the like. In some implementations, media player 1472 may employ a graphical user interface (GUI) that typically employs menus, drop down menus, icons and/or a point-and-click interface via display 1476 and/or user input 1477. Media player 1472 further includes an audio output 1475 such as a speaker and/or audio output jack. Signal processing and/or control circuits 1471 and/or other circuits (not shown) of media player 1472 may process data, perform coding and/or encryption, perform calculations, format data and/or perform any other media player function.

Media player 1472 may communicate with mass data storage 1470 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example HDDs and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". Media player 1472 may be connected to memory 1473 such as RAM, ROM, low latency nonvolatile memory such as flash memory and/or other suitable electronic data storage. Media player 1472 also may support connections with a WLAN via a WLAN network interface 1474.

Figure 14H:
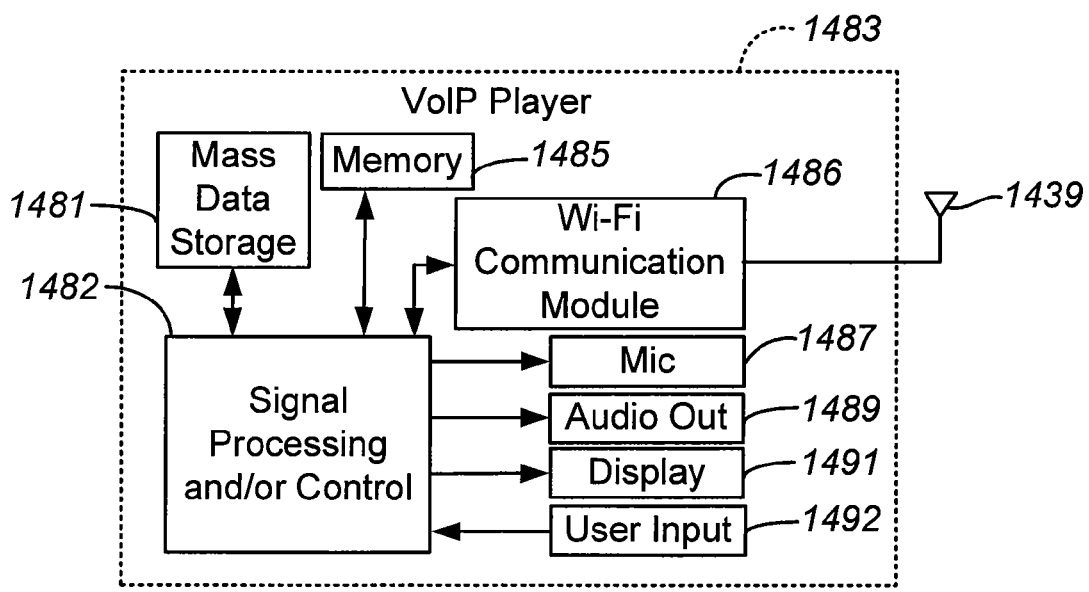

Referring to FIG. 14H, the present invention may be embodied in a Voice over Internet Protocol (VoIP) phone 1483 that may include an antenna 1439. The present invention may implement either or both signal processing and/or control circuits, which are generally identified in FIG. 14H at 1482, a wireless interface and/or mass data storage of the VoIP phone 1483. In some implementations, VoIP phone 1483 includes, in part, a microphone 1487, an audio output 1489 such as a speaker and/or audio output jack, a display monitor 1491, an input device 1492 such as a keypad, pointing device, voice actuation and/or other input devices, and a Wireless Fidelity (Wi-Fi) communication module 1486. Signal processing and/or control circuits 1482 and/or other circuits (not shown) in VoIP phone 1483 may process data, perform coding and/or encryption, perform calculations, format data and/or perform other VoIP phone functions.

VoIP phone 1483 may communicate with mass data storage 1402 that stores data in a nonvolatile manner such as optical and/or magnetic storage devices, for example hard disk drives HDD and/or DVDs. At least one HDD may have the configuration shown in FIG. 14A and/or at least one DVD may have the configuration shown in FIG. 14B. The HDD may be a mini HDD that includes one or more platters having a diameter that is smaller than approximately 1.8". VoIP phone 1483 may be connected to memory 1485, which may be a RAM, ROM, low latency nonvolatile memory such as flash memory and/or other suitable electronic data storage. VoIP phone 1483 is configured to establish communications link with a VoIP network (not shown) via Wi-Fi communication module 1486. Still other implementations in addition to those described above are contemplated.

The above embodiments of the present invention are illustrative and not limitative. Various alternatives and equivalents are possible. The invention is not limited by the type of comparator, counter, pulse-width modulator, driver, or filter used. The invention is not limited by the type of amplifier used to establish the reference charging and discharging currents. The invention is not limited by the of oscillator. The invention is not limited by the type of integrated circuit in which the present disclosure may be disposed. Nor is the invention limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A controller for a multi-level solid state non-volatile memory array having memory cells, the memory cells adapted to store data using a first number of digital levels, the controller configured to:
   encode a series of data bits to generate a series of encoded data bits;
   convert the series of encoded data bits into a series of data symbols;
   send, to the memory array, a stored series of data symbols based on the series of data symbols for storage in a memory cell of the multi-level solid state non-volatile memory array;
   generate an output signal based on data associated with the stored series of data symbols, the output signal characterized by a second number of digital levels greater than the first number of digital levels used to store the series of data symbols in the memory cell; and
   output a series of output data symbols based on the output signal.

2. The controller of claim 1 comprising:
   a first encoder;
   a first decoder;
   a second encoder in communication with the first encoder; and
   a second decoder in communication with the first decoder.

3. The controller of claim 2 wherein the first encoder is adapted to perform a first ECC technique and the second encoder is adapted to perform a second ECC technique.

4. The controller of claim 3 wherein the first ECC technique is different from the second ECC technique.

5. The controller of claim 1 wherein the multi-level solid state non-volatile memory array comprises one or more flash EEPROM arrays.

6. The controller of claim 1 wherein the output signal is generated based on soft information.

7. A method of operating a controller for a multi-level solid state non-volatile memory array having memory cells, the memory cells adapted to store data using a first number of digital levels, the method comprising:

encoding a series of data bits to generate a series of encoded data bits;

converting the series of encoded data bits into a series of data symbols;

sending, to the memory array, a stored series of data symbols based on the series of data symbols for storage in a memory cell of the multi-level solid state non-volatile memory array;

generating an output signal based on data associated with the stored series of data symbols, the output signal characterized by a second number of digital levels greater than the first number of digital levels used to store the series of data symbols in the memory cell; and outputting a series of output data symbols based on the output signal.

8. The method of claim 7 further comprising:

encoding data bits to generate the series of data bits; and decoding the series of output data symbols.

9. The method of claim 8 wherein the encoding of the data bits is performed in accordance with a first ECC technique and the encoding of the series of data bits is performed in accordance with a second ECC technique.

10. The method of claim 9 wherein the first ECC technique is different from the second ECC technique.

11. The method of claim 7 wherein the multi-level solid state non-volatile memory array comprises one or more flash EEPROM arrays.

12. The method of claim 7 wherein the output signal comprises soft information.

13. A controller for a multi-level solid state non-volatile memory array having memory cells, the memory cells adapted to store data using a first number of digital levels, the controller comprising:

means for encoding a series of data bits to generate a series of encoded data bits;

means for converting the series of encoded data bits into a series of data symbols;

means for sending, to the memory array, a stored series of data symbols based on the series of data symbols for storage in a memory cell of the multi-level solid state non-volatile memory array;

means for generating an output signal based on data associated with the stored series of data symbols, the output signal characterized by a second number of digital levels greater than the first number of digital levels used to store the series of data symbols in the memory cell; and means for outputting a series of output data symbols based on the output signal.

14. The controller of claim 13 further comprising:

means for encoding data bits to generate the series of data bits; and means for decoding the series of output data symbols.

15. The controller of claim 14 wherein the encoding of the data bits is performed in accordance with a first ECC technique and the encoding of the series of data bits is performed in accordance with a second ECC technique.

16. The controller of claim 15 wherein the first ECC technique is different from the second ECC technique.

17. The controller of claim 13 wherein the multi-level solid state non-volatile memory array comprises one or more flash EEPROM arrays.

18. The controller of claim 13 wherein the output signal comprises soft information.

\* \* \* \* \*